(12) United States Patent
Ho et al.

(10) Patent No.: US 8,937,523 B1
(45) Date of Patent: Jan. 20, 2015

(54) TRANSFORMER HYBRID

(71) Applicant: National Taiwan University, Taipei (TW)

(72) Inventors: Chieh-Jui Ho, Taipei (TW); Hen-Wai Tsao, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 14/334,664

(22) Filed: Jul. 18, 2014

(30) Foreign Application Priority Data

Aug. 6, 2013 (TW) .............................. 102128174 A

(51) Int. Cl.
*H01F 5/00* (2006.01)
(52) U.S. Cl.
USPC ........................................................ 336/200
(58) Field of Classification Search
USPC .............................. 336/65, 200, 232; 257/531
See application file for complete search history.

(56) References Cited

U.S. PATENT DOCUMENTS

| | | | | |
|---|---|---|---|---|
| 5,363,081 A | * | 11/1994 | Bando et al. | 336/200 |
| 5,942,965 A | * | 8/1999 | Kitamura et al. | 336/200 |
| 7,642,618 B2 | * | 1/2010 | Shiramizu et al. | 257/531 |
| 7,812,701 B2 | * | 10/2010 | Lee et al. | 336/200 |

* cited by examiner

*Primary Examiner* — Tuyen Nguyen
(74) *Attorney, Agent, or Firm* — Huffman Law Group, PC

(57) ABSTRACT

A transformer hybrid is disclosed. The transformer hybrid comprises a substrate, a first conductor, a second conductor, a first coil, and a second coil. The first conductor includes a first elongate portion having a first side and a second side. The second conductor includes a second elongate portion having a third side and a fourth side, and the orientation of the second conductor intersects with that of the first conductor. The first coil is located near the first side and the third side. The second coil is located near the first side and the fourth side. When the direction of the loading current in the first coil is the same with that in the second coil, the first conductor has an inductive electromotive force. When the direction of the loading current in the first coil is different from that in the second coil, the second conductor has another inductive electromotive force. When phase difference exists between the loading currents, the two loading currents can be resolved to common mode and differential mode, so the inductive electromotive forces can be produced on the both conductors.

21 Claims, 6 Drawing Sheets

TRANSFORMER HYBRID

CROSS-REFERENCE TO RELATED APPLICATION(S)

This application claims priority to Taiwan Patent Application No. 102128174, filed on Aug. 6, 2013, the disclosure of which is hereby incorporated by reference in its entirety.

BACKGROUND

1. Field of the Disclosure

The present disclosure relates to a transformer hybrid, and more particularly, to a transformer hybrid with multiple input terminals.

2. Description of the Related Art

As the communication technology such as mobile phone, internet and digital TV become more popular and growth rapidly, the need of high quality and low cost CMOS power amplifier is increasing. However, one of the main problems of the current CMOS process is the low breakdown voltage and the high substrate loss of the silicon, therefore, the approach of power combination through the transformer or hybrid is proposed in order to reduce the area of the transistors as well as increase the output power and efficiency.

However, traditional transformer combiners would produce large peak voltage when power cells are operated with phase difference. And traditional hybrid that implemented by transmission lines or lots of passive components is too large for chip design.

Therefore, the transformer hybrid is very suitable to the mobile power amplifiers that requires high linearity and high output power level.

SUMMARY

The present disclosure describes a transformer hybrid with small volume.

In an embodiment, the transformer hybrid comprises a substrate, a first conductor, a second conductor, a first coil, and a second coil. The first conductor is disposed on the substrate, and has a first elongated portion comprising a first side and a second side. The second conductor is disposed on the substrate and adjacent to the first side, and has a second elongated portion comprising a third side and fourth side. An orientation of the second elongated portion crosses an orientation of the first elongated portion. The first coil is disposed on the substrate and adjacent to the first side and the third side, and has a first positive input terminal and a first negative input terminal facing with each other to form a first opening and configured to receive differential signals. The second coil is disposed on the substrate and adjacent to the first side and the fourth side, and has a second positive input terminal and a second negative input end facing with each other to form a second opening and configured to receive the different signals. When loading currents of the first coil and the second coil are in a same direction, the first conductor generates a first induction electromotive force, and when loading currents of the first coil and the second coil are in opposite directions, the second conductor generates a second induction electromotive force.

In an embodiment, the transformer hybrid comprises a substrate, a circular conductor, a 8-shape conductor, a first coil, and a second coil. The circular conductor is disposed on the substrate, and has a first output terminal and a second output terminal facing with each other to form a first opening. The 8-shape conductor is disposed on the substrate and surrounded with the circular conductor, and has a first circular portion, a second circular portion, a first cross portion, a third output terminal and a fourth output terminal. The first cross portion is connected between the first circular portion and the second circular portion. The third output terminal and the fourth output terminal faces with each other to form a second opening. The first coil is disposed on the substrate and surrounded with the first circular portion, and has a first positive input terminal and a first negative input terminal facing with each other to form a third opening and configured to receive differential signals. The second coil is disposed on the substrate and surrounded with the second circular portion, and has a second positive input terminal and a second negative input terminal facing with each other to form a fourth opening and configured to receive the differential signals. When loading currents of the first coil and the second coil are in a same direction, the circular conductor generates a first induction electromotive force, and when loading currents of the first coil and the second coil are in opposite directions, the 8-shape conductor generates a second induction electromotive force.

Overall, the present disclosure describes transformer hybrids with two coils for dual input. Each of the transformer hybrids has small volumes, anti-interference ability and high power capacity. Further, when the transformer hybrid is applied for the power amplifier, which has the advantage of high impedance transformation coefficient.

The foregoing is a summary and shall not be construed to limit the scope of the claims. The operations and devices disclosed herein may be implemented in a number of ways, and such changes and modifications may be made without departing from this disclosure and its broader aspects. Other aspects, inventive features, and advantages, as defined solely by the claims, are described in the non-limiting detailed description set forth below.

DETAILED DESCRIPTION OF EMBODIMENTS

For a more complete understanding of the present disclosure and its advantages, reference is now made to the following description taken in conjunction with the accompanying drawings, in which like reference numbers indicate like features. One of ordinary skill in the art will understand other varieties for implementing example embodiments, including those described herein. The drawings are not limited to specific scale and similar reference numbers are used for representing similar elements. As used in the disclosure and the appended claims, the terms "example embodiment," "exemplary embodiment," and "present embodiment" do not necessarily refer to a single embodiment, although it may, and various example embodiments may be readily combined and interchanged, without departing from the scope or spirit of the present disclosure. Furthermore, the terminology as used herein is for the purpose of describing example embodiments only and is not intended to be a limitation of the disclosure. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any and all possible combinations of one or more of the associated listed items.

Figure 1A:
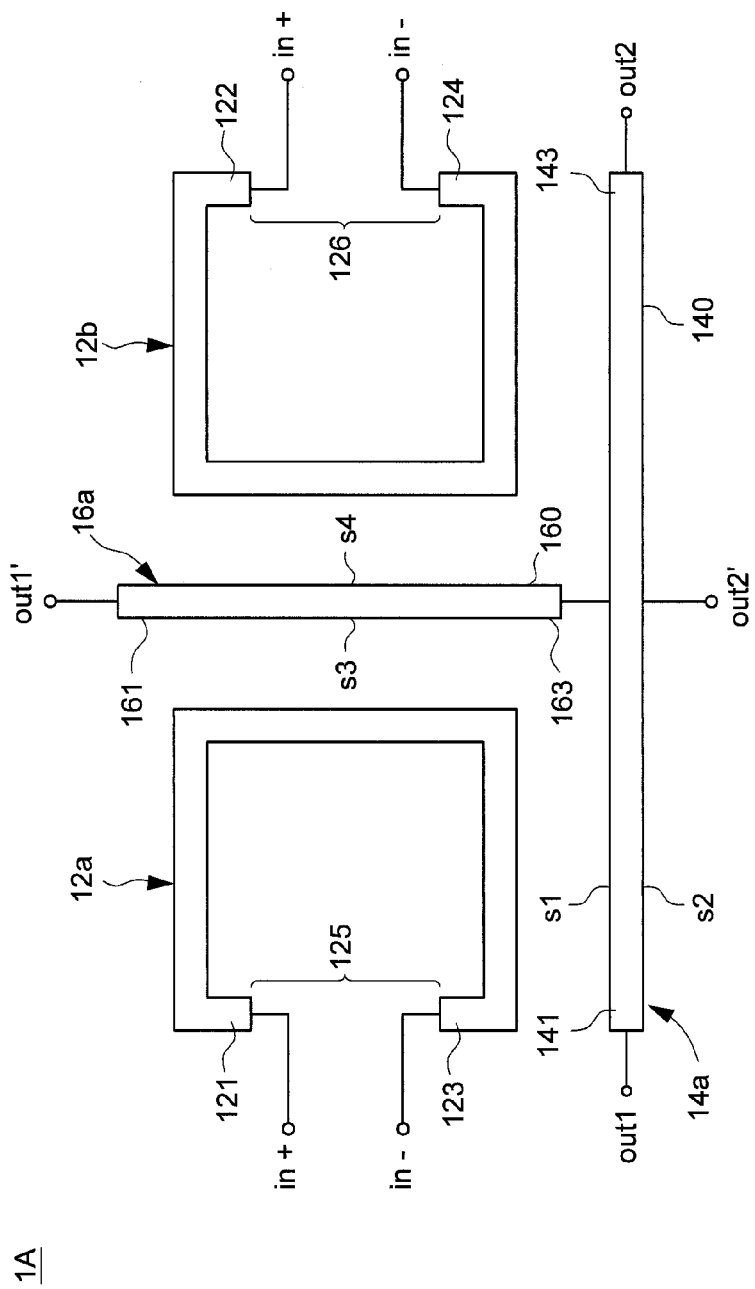
FIG. 1A depicts a schematic diagram illustrating a transformer hybrid, in accordance with a first embodiment of the present disclosure.

FIG. 1A depicts a schematic diagram illustrating a transformer hybrid, in accordance with a first embodiment of the present disclosure. The transformer hybrid 1A may comprise a substrate (not shown), a first conductor 14a, a second conductor 16a, a first coil 12a, and a second coil 12b. The first conductor 14a, the second conductor 16a, the first coil 12a, and the second coil 12b are formed in the same layer or different layers on the substrate by using the semiconductor process. In other words, the first conductor 14a, the second conductor 16a, the first coil 12a, and the second coil 12b may have different level heights on the substrate. In an embodiment, the substrate may be a ceramic substrate, a silicon substrate or a printed circuit board. In an alternative embodiment, the first conductor 14a, the second conductor 16a, the first coil 12a, and the second coil 12b may be suspended on the substrate by the RFMEMS transformer fabrication process.

The first coil 12a and the second coil 12b may act as first and second primary loops of the transformer hybrid 1A, respectively. The first conductor 14a and the second conductor 16a may act as first and second secondary loops of the transformer hybrids 1A. Each of the first and second secondary loops 14a, 16a may be induced by the first and second primary loops 12a, 12b to generate induction electromotive force via proper arrangement of positions and distances of them.

The first conductor 14a may comprise a first elongated portion 140. The first elongated portion 140 may have a first output terminal 141, a second output terminal 143, a first side s1, and a second side s2. The second conductor 16a may comprise a second elongated portion 160. The second elongated portion 160 may have a third output terminal 161, a fourth output terminal 163, a third side s3, and a fourth side s4. The second elongated portion 160 may be adjacent to the first side s1. An orientation of the second elongated portion 160 crosses an orientation of the first elongated portion 140. That is, the second elongated portion 160 has a predetermined angle with respect to the first elongated portion 140, for example, greater or smaller than 90°. The second elongated portion 160 may be adjacent to the first side s1. In an alternative embodiment, the second elongated portion 160 may be adjacent to the second side s2 and have a predetermined angle with respect to the first elongated portion 140.

In an embodiment, the first coil 12a is adjacent to or between the first side s1 and the third side s3. The first coil 12a may comprise a first positive input terminal 121 and a first negative input terminal 123. The first positive input terminal 121 and the first negative input terminal 123 are spaced apart and opposite with each other or face with each other to form a first opening 125. The first positive input terminal 121 and the first negative input terminal 123 are configured to receive differential signals in+, in–, so as to induce an alternative current on the first coil 12a. Similarly, the second coil 12b is adjacent to or between the first side s1 and fourth side s4. The second coil 12b may comprise a second positive input terminal 122 and a second negative input terminal 124 spaced apart and opposite with each other or face with each other to form a second opening 126. The second positive input terminal 122 and the second negative input terminal 124 are configured to receive the differential signals in+, in–, so as to induce an alternative current on the second coil 12b. The polarities of the differential signals in+, in– are not limited to the ones shown in FIG. 1A. The positions of the first opening 125 and second opening 126 are not limited to the ones shown in FIG. 1A. The first coil 12a and the second coil 12b may be identical. The number of the coils is not limited to the ones shown in FIG. 1A, and at least one coil adjacent to the first and second conductor 14a, 16b may implement the transformer hybrid. Each of the coils 12a, 12b are not limited to the single turn winding structure as shown in FIG. 1A, it also may be multiple turns such as Nturns, in which N is an integer.

Each of the shape of the first coil 12a and the second coil 12b may circle loop, square loop, rectangular loop, or polygon loop with one opening. At least one side of the first coil 12a and the second coil 12b should be adjacent to the first and second conductors 14a, 16a. The directions of the loading currents of the first coil 12a and the second coil 12b may be exchanged by controlling the polarities of the differential signals in+, in– of the input terminals 121-124. For example, when the input terminal 121 receives a positive input signal in+, the direction of the loading current on the first coil 12a is clockwise. When the input terminal 121 receive a negative input signal in–, the direction of the loading current on the first coil 12a is counterclockwise. When the input terminal 122 receives a positive input signal in+, the direction of the loading current on the second coil 12b is counterclockwise. When the input terminal 122 receive a negative input signal in–, the direction of the loading current on the second coil 12b is clockwise.

When the loading currents of the first coil 12a and the second coil 12b are in a same direction, such as in clockwise, the first conductor 14a generates a first induction electromotive force. More specifically, the voltage level of the output voltage out2 of the second output terminal 143 is greater than that of the output voltage out1 of the first output terminal 141. At the same time, there is no induction electromotive force generated by the second conductor 16a.

When the loading currents of the first coil 12a and the second coil 12b are in opposite directions, such as the loading current of the first coil 12a is in clockwise, and the loading current of the second coil 12b is in counter clockwise, the second conductor 16a generates a second induction electromotive force. More specifically, the voltage level of the output voltage out1' of the third output terminal 161 is greater than that of the output voltage out2' of the fourth output terminal 163. At the same time, there is no induction electromotive force generated by the first conductor 14a. In an embodiment, each of the first conductor 14a and the second conductor 16a may have a single terminal output or dual terminal outputs, as needed.

Figure 1B:
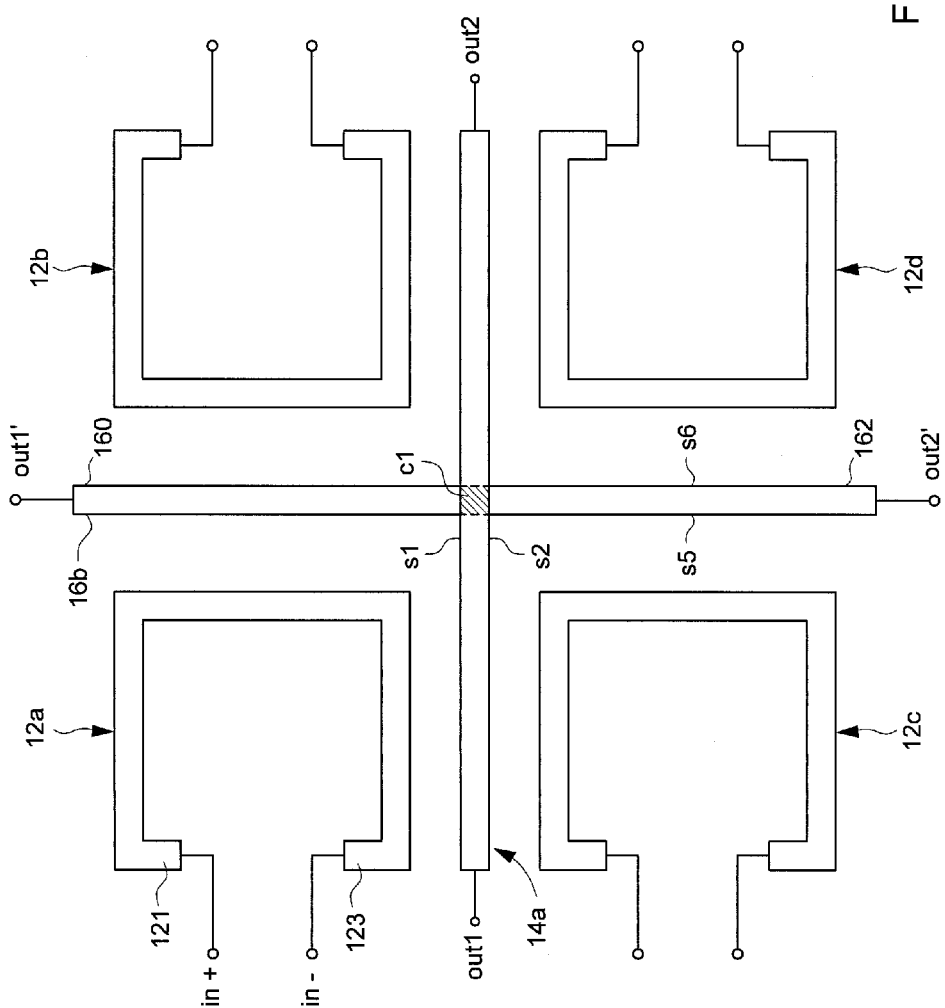
FIG. 1B depicts a schematic diagram illustrating a transformer hybrid, in accordance with a second embodiment of the present disclosure.

FIG. 1B depicts a schematic diagram illustrating a transformer hybrid, in accordance with a second embodiment of the present disclosure. The transformer hybrid 1B of the second embodiment is similar to the transformer hybrid A1 of the first embodiment. The transformer hybrid 1B comprises a substrate (not shown), a first conductor 14a, a second conductor 16b, a first coil 12a, and a second coil 12b. The arrangement of the coils 12a, 12b with respect to the conductors 14a, 16b is the same as that of the first embodiment. The difference between the transformer hybrid 1B and the transformer hybrid 1A is that the second conductor 16b of the transformer hybrid 1B further comprises a third elongated portion 162 and a cross portion c1 disposed on the substrate. The third elongated portion 162 comprises a fifth side s5 and sixth side s6. The cross portion c1 is connected between the second elongated portion 160 and the third elongated portion 162 and overlaps the first conductor 14a. The third elongated portion 162 is adjacent to the second side s2. The cross portion c1 of the second conductor 16b and the first elongated portion 140 have different level heights on the substrate, that is the cross portion c1 does not electrically connected to the first elongate portion 140. Extension directions of the third elongated portion 162 and the second elongated portion 160 are in a same direction.

Further, the transformer hybrid 1B may comprise a third coil 12c, and a fourth coil 12d disposed on the substrate. Each of the third coil 12c and the fourth coil 12d has an opening and is identical with the first coil 12a. The third coil 12c is adjacent to or between the second side s2 and the fifth side s5. The fourth coil 12d is adjacent to or between the second side s2 and the sixth side s6. Each of the third coil 12c and the fourth coil 12d has at least one turn winding.

When the loading currents of the first coil 12a and the second coil 12b are in a first direction, and the loading currents of the third coil 12c and the fourth coil 12d are in a second direction opposite to the first direction, the first conductor 14a generates a third induction electromotive force. At the same time, there is no induction electromotive force generated by the second conductor 16b.

When the loading currents of the first coil 12a and the third coil 12c are in a third direction, and the loading currents of the second coil 12b and the fourth coil 12d are in a fourth direction opposite to the third direction, the second conductor 16b generates a fourth induction electromotive force. At the same time, there is no induction electromotive force generated by the first conductor 14a.

Figure 1C:
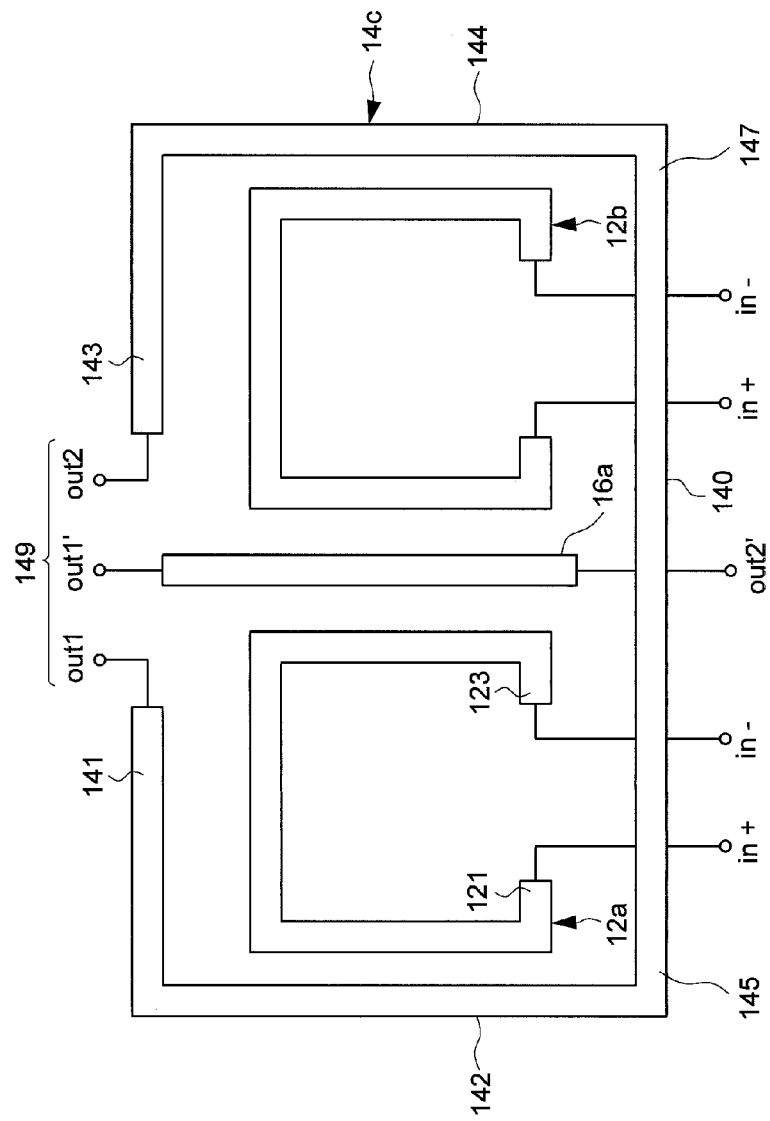
FIG. 1C depicts a schematic diagram illustrating a transformer hybrid, in accordance with a third embodiment of the present disclosure.

FIG. 1C depicts a schematic diagram illustrating a transformer hybrid, in accordance with a third embodiment of the present disclosure. The transformer hybrid 1C of the third embodiment is similar to the transformer hybrid A1 of the first embodiment. The transformer hybrid 1C comprises a substrate (not shown), a first conductor 14c, a second conductor 16a, a first coil 12a, and a second coil 12b. The arrangement of the coils 12a, 12b with respect to the conductor 16a is the same as that of the first embodiment. The difference between the transformer hybrid 1C and the transformer hybrid 1A is that the first conductor 14c of the transformer hybrid 1C further comprises a fourth elongated portion 142 and a fifth elongated portion 144. The first elongated portion 140 has a first end 145 and a second end 147. The first end 145 is connected to the fourth elongated portion 142, and the second end 147 is connected to the fifth elongated portion 144. The first elongated portion 140, the fourth elongated portion 142 and the fifth elongated portion 144 form a fifth coil (i.e. the first conductor 14c) with a fifth opening 149. The fifth coil 14c surrounds the second conductor 16a, the first coil 12a and the second coil 12b.

The fifth coil 14c further comprises a cross portion (not shown) overlapping the second conductor 16a, the first coil 12a, or the second coil 12b. The cross portion and the second conductor 16a, the first coil 12a, or the second coil 12b have different level heights on the substrate.

When the loading currents of the first coil 12a and the second coil 12b are in a fifth direction, the first conductor 14c generates a fifth induction electromotive force. At the same time, there is no induction electromotive force generated by the second conductor 16a.

When the loading currents of the first coil 12a and the second coil 12b are in opposite directions, the second conductor 16a generates a sixth induction electromotive force. At the same time, there is no induction electromotive force generated by the first conductor 14c.

Figure 1D:
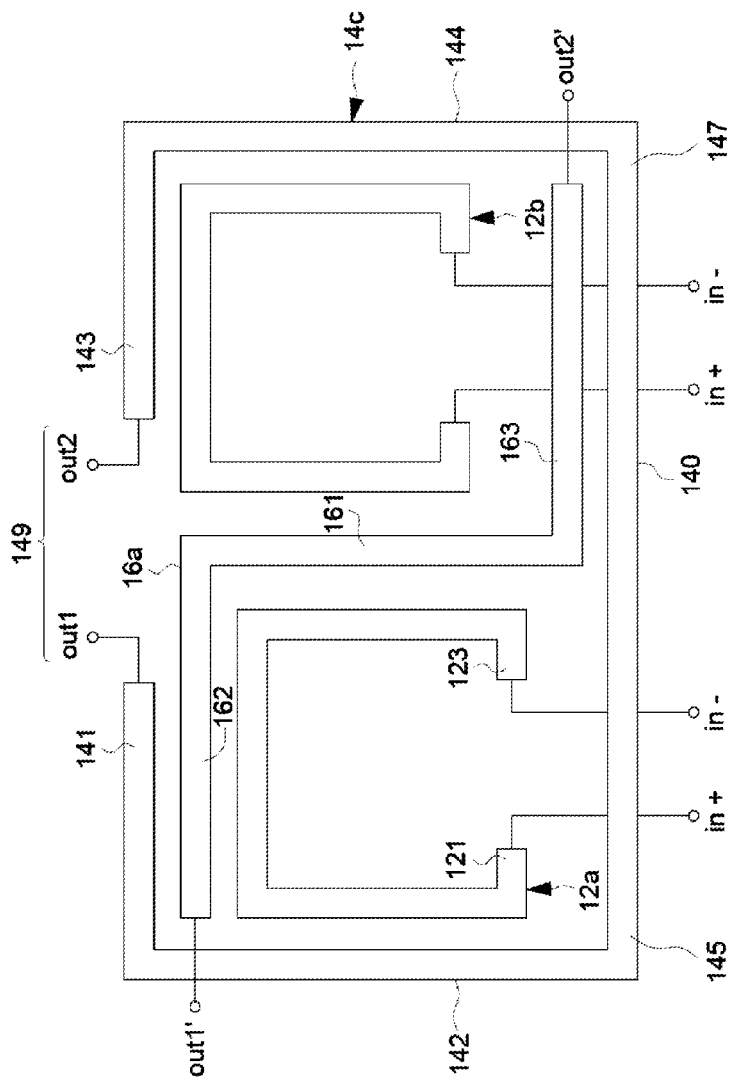
FIG. 1D depicts a schematic diagram illustrating a transformer hybrid, in accordance with a fourth embodiment of the present disclosure.

Alternatively, the transformer hybrid, in accordance with the third embodiment of the present disclosure can make a little change. As shown in FIG. 1D, the second conductor 16a can stretch in the horizontal direction from both ends. That is, the second conductor 16a consisted three portions of a vertical part 161, and a first horizontal part 162 and a second horizontal part 163. Those two horizontal parts 162, 163 are parallel located between the coils 12a, 12b and second output terminal 143, first output terminal 143, respectively.

Figure 1E:
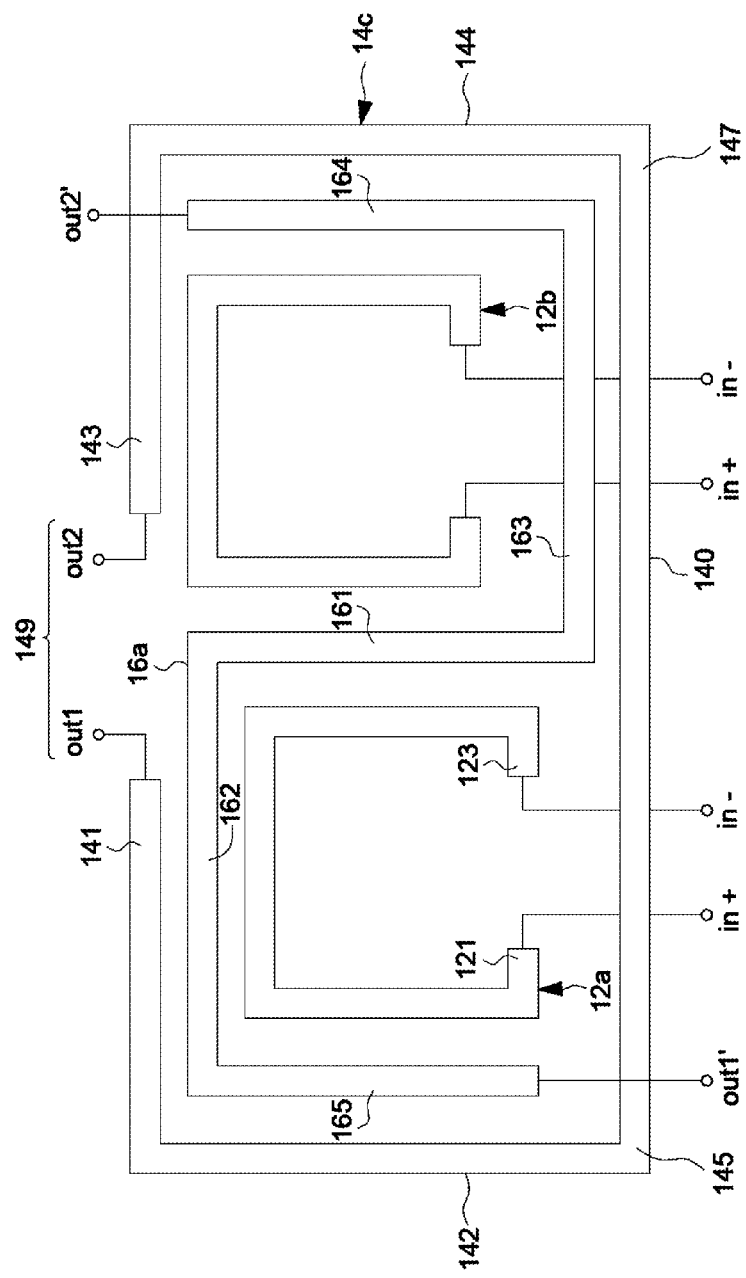
FIG. 1E depicts a schematic diagram illustrating a transformer hybrid, in accordance with a fifth embodiment of the present disclosure.

Alternatively, the transformer hybrid, in accordance with the third embodiment of the present disclosure can make a little more change. As shown in FIG. 1E, the second conductor 16a can stretch further in the vertical direction from both ends. That is, the second conductor 16a consisted five portions of a first vertical parts 161, a second vertical parts 164, a third vertical parts 165, a first horizontal part 162 and a second horizontal part 163. Those two horizontal parts 162, 163 are parallel located between the coils 12a, 12b and second output terminal 143, first output terminal 143, respectively, while those two vertical parts 165, 164 are parallel located between the coils 12a, 12b and fourth elongated portion 142, fifth elongated portion 144, respectively.

Figure 2:
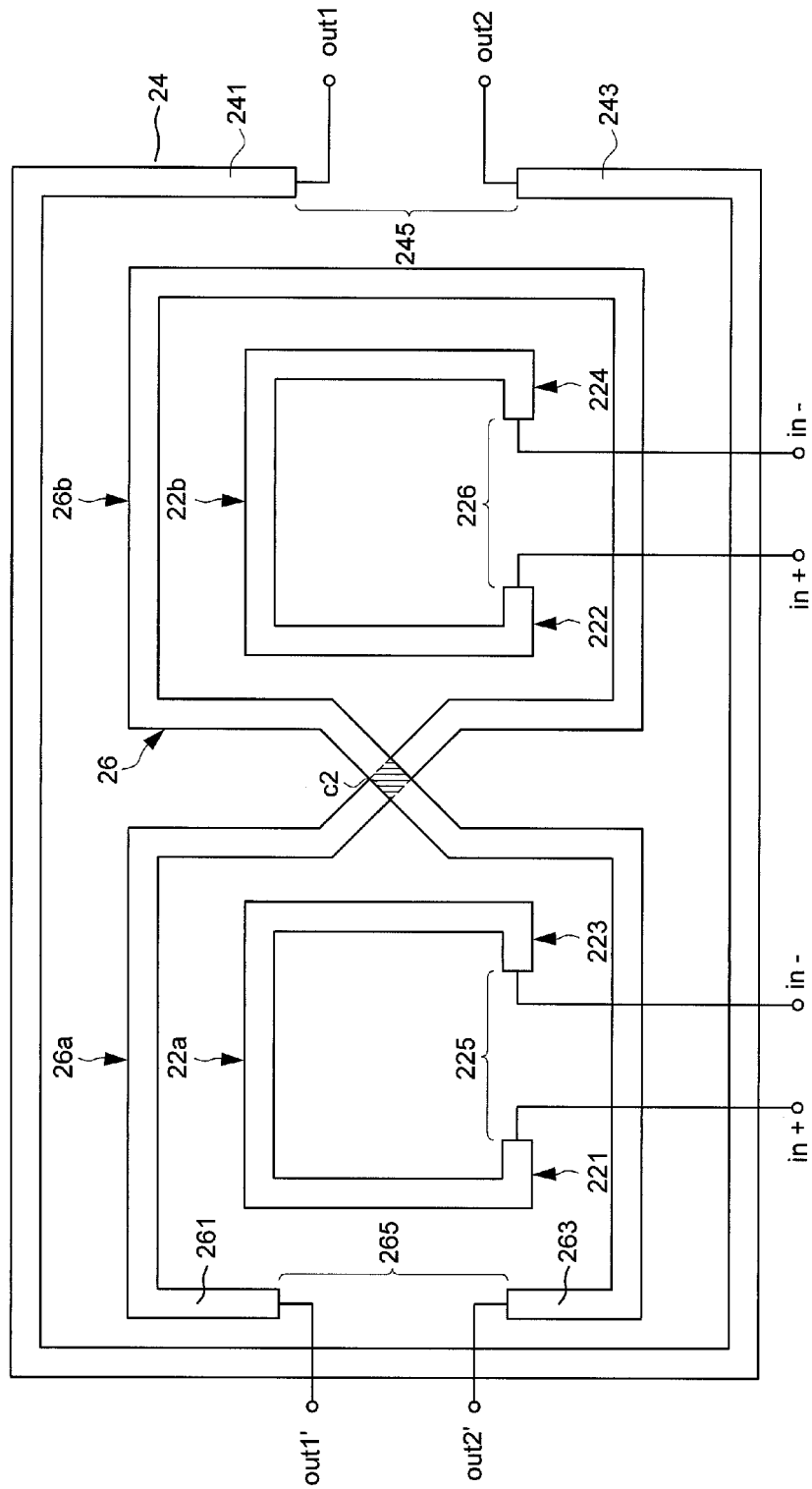
FIG. 2 depicts a schematic diagram illustrating a transformer hybrid, in accordance with a fourth embodiment of the present disclosure.

FIG. 2 depicts a schematic diagram illustrating a transformer hybrid, in accordance with a fourth embodiment of the present disclosure. The transformer hybrid 2 comprises a substrate (not shown), a circular conductor 24, a 8-shape conductor 26, a first coil 22a, and a second coil 22b. The circular conductor 24, the 8-shape conductor 26, the first coil 22a, and the second coil 22b are formed in the same layer or different layers on the substrate by using the semiconductor process. In other words, the circular conductor 24, the 8-shape conductor 26, the first coil 22a, and the second coil 22b may have different level heights on the substrate.

In an embodiment, the circular conductor 24 comprises a first output terminal 241 and a second output terminal 243. The first output terminal 241 and the second output terminal 243 are spaced apart and opposite with each other or face with each other to form a first opening 245. The 8-shape conductor 26 is disposed on the substrate and surrounded with the circular conductor 24. The 8-shape conductor 26 comprises a first circular portion 26a, a second circular portion 26b, a first cross portion c2, a third output terminal 261 and a fourth output terminal 263. The first cross portion c2 is connected between the first circular portion 26a and the second circular portion 26b. The third output terminal 261 and the fourth output terminal 263 face with each other to form a second opening 265. The second opening 265 may be located on the first circular portion 26a or the second circular portion 26b. The first cross portion c2 of 8-shape conductor 26 may have two different level heights on the substrate.

The first coil 22a may be surrounded with one of the first circular portion 26a and the second circular portion 26b, and the second coil 22b may be surrounded with another one of the first circular portion 26a and the second circular portion 26b. The first coil 22a comprises a first positive input terminal 221 and a first negative input terminal 223 spaced apart and opposite with each other or face with each other to form a third opening 225. The first positive input terminal 221 and the first negative input terminal 223 are configured to receive the differential signals in+, in−, so as to induce an alternative current on the circular conductor 24 or the 8-shape conductor 26.

Similarly, the second coil 22b comprises a second positive input terminal 222 and a second negative input terminal 224 spaced apart and opposite with each other or face with each other to form a fourth opening 226. The second positive input terminal 222 and the second negative input terminal 224 are configured to receive the differential signals in+, in−, so as to induce an alternative current on the circular conductor 24 or the 8-shape conductor 26.

In an embodiment, the circular conductor 24 further comprises a second cross portion (not shown) overlapping the 8-shape conductor 26. The second cross portion and the 8-shape conductor 26 have different level heights on the substrate. In an embodiment, the circular conductor 24 further comprises a third cross portion (not shown) overlapping the first coil 22a or the second coil 22b. The third cross portion and the first coil 22a or the second coil 22b have different level heights on the substrate. In an embodiment, the 8-shape conductor 26 further comprises a fourth cross portion (not shown) overlapping the first coil 22a or the second coil 22b. The fourth cross portion and the first coil 22a or the second coil 22b have different level heights on the substrate.

In an embodiment, each of the first coil 22a and the second coil 22b may be in circle loop, square loop, rectangular loop, or polygon loop shape. In an embodiment, each of the first circular portion 26a and the second circular portion 26b may be in circle loop, square loop, rectangular loop, or polygon loop shape. Each of the coils 22a, 22b, the circular conductor 24, and the circular portions 26a, 26b are not limited to the single turn winding structure as shown in FIG. 2, it also may be multiple turns such as N turns, in which N is an integer.

The directions of the loading currents of the coils 22a, 22b may be exchanged by controlling the polarities of the differential signals in+, in− of the input terminals 221-224 of the coils 22a, 22b. For example, when the loading currents of the first coil 22a and the second coil 22b are in a same direction, the circular conductor 24 generates a first induction electromotive force. At the same time, there is no induction electromotive force generated by the 8-shape conductor 26. When the loading currents of the first coil 22a and the second coil 22b are in opposite directions, the 8-shape conductor 26 generates a second induction electromotive force. At the same time, there is no induction electromotive force generated by the circular conductor 24.

Accordingly, each transformer hybrid of above-mentioned embodiments has at least two primary windings and two secondary windings. At least one of the two secondary windings could generate an induction electromotive force by controlling the polarities of the differential signals in+, in− of the input terminals of the two primary windings. Moreover, the structures of the above-mentioned transformer hybrids are simple, which is favorable for being designed and implemented in the field of system on chip applications.

Realizations in accordance with the present disclosure have been described in the context of particular embodiments. These embodiments are meant to be illustrative and not limiting. Many variations, modifications, additions, and improvements are possible. Accordingly, plural instances may be provided for components described herein as a single instance. Structures and functionality presented as discrete components in the exemplary configurations may be implemented as a combined structure or component. These and other variations, modifications, additions, and improvements may fall within the scope of the invention as defined in the claims that follow.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the embodiment(s) set out in any claims that may issue from this disclosure. Specifically and by way of example, although the headings refer to a "Field of the Disclosure," the claims should not be limited by the language chosen under this heading to describe the so-called field. Further, a description of a technology in the "Background" is not to be construed as an admission that certain technology is prior art to any embodiment(s) in this disclosure. Neither is the "Summary" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

What is claimed is:

1. A transformer hybrid, comprising:
   a substrate;
   a first conductor, disposed on the substrate, and having a first elongated portion comprising a first side and a second side;
   a second conductor, disposed on the substrate and adjacent to the first side, and having a second elongated portion comprising a third side and fourth side, wherein an orientation of the second elongated portion crosses an orientation of the first elongated portion;
   a first coil, disposed on the substrate and adjacent to the first side and the third side, and having a first positive input terminal and a first negative input terminal facing with each other to form a first opening and configured to receive differential signals; and
   a second coil, disposed on the substrate and adjacent to the first side and the fourth side, and having a second positive input terminal and a second negative input terminal facing with each other to form a second opening and configured to receive the differential signals;
   wherein when loading currents of the first coil and the second coil are in the same clock-wise direction, the first conductor generates a first induction electromotive force, and when loading currents of the first coil and the second coil are in opposite clock-wise directions, the second conductor generates a second induction electromotive force.

2. The transformer hybrid according to claim 1, wherein the shape of the first coil and the second coil is circle loop, square loop, rectangular loop, or polygon loop with an opening.

3. The transformer hybrid according to claim 1, wherein each of the first coil and the second coil has at least one turn winding.

4. The transformer hybrid according to claim 1, wherein the second conductor further has a third elongated portion and a cross portion, the cross portion is connected between the second elongated portion and the third elongated portion and overlaps the first conductor, the third elongated portion is adjacent to the second side, extension directions of the third elongated portion and the second elongated portion are in the same direction.

5. The transformer hybrid according to claim 4, wherein the cross portion of the second conductor and the first elongated portion have different level heights on the substrate.

6. The transformer hybrid according to claim 4, further comprising a third coil with a third opening and a fourth coil with a fourth opening, wherein the third elongated portion has a fifth side and sixth side, the third coil is adjacent to the second side and the fifth side, and the fourth coil is adjacent to the second side and the sixth side.

7. The transformer hybrid according to claim 6, wherein when the loading currents of the first coil and the second coil are in the first clockwise direction, and the loading currents of the third coil and the fourth coil are in the second clockwise direction opposite to the first direction, the first conductor generates a third induction electromotive force; when the loading currents of the first coil and the third coil are in the third clockwise direction, and the loading currents of the second coil and the fourth coil are in the fourth clockwise direction opposite to the third direction, the second conductor generates a fourth induction electromotive force.

8. The transformer hybrid according to claim 6, wherein each of the third coil and the fourth coil has at least one turn winding.

9. The transformer hybrid according to claim 1, wherein the first conductor further comprises a fourth elongated portion and fifth elongated portion, the first elongated portion has a first end and a second end, the first end is connected to the fourth elongated portion, the second end is connected to the fifth elongated portion, the first elongated portion, the fourth elongated portion and the fifth elongated portion form a fifth coil with a fifth opening, and the fifth coil surrounds the second conductor, the first coil and the second coil.

10. The transformer hybrid according to claim 9, wherein the fifth opening located on the first or fourth or fifth elongated portion.

11. The transformer hybrid according to claim 9, wherein the fifth coil further comprises cross portions overlapping the second conductor, the first coil, or the second coil, and the cross portion and the second conductor, the first coil, or the second coil have different level heights on the substrate.

12. The transformer hybrid according to claim 9, wherein the second conductor further comprising two first additional elongated portions extended from the third side and the fourth side, wherein the two first additional elongated portions are roughly perpendicular to the second elongated portion.

13. The transformer hybrid according to claim 12, wherein the second conductor further comprising two second additional elongated portions extended from the two first additional elongated portions respectively, wherein the two second additional elongated portions are roughly perpendicular to the two first additional elongated portions.

14. A transformer hybrid, comprising:
a substrate;
a circular conductor, disposed on the substrate, and having a first output terminal and a second output terminal facing with each other to form a first opening;
an 8-shape conductor, disposed on the substrate and surrounded with the circular conductor, and having a first circular portion, a second circular portion, a first cross portion, a third output terminal and a fourth output terminal, wherein the first cross portion is connected between the first circular portion and the second circular portion, and the third output terminal and the fourth output terminal faces with each other to form a second opening;
a first coil, disposed on the substrate and surrounded with the first circular portion, and having a first positive input terminal and a first negative input terminal facing with each other to form a third opening and configured to receive differential signals; and
a second coil, disposed on the substrate and surrounded with the second circular portion, and having a second positive input terminal and a second negative input terminal facing with each other to form a fourth opening and configured to receive the differential signals;
wherein when loading currents of the first coil and the second coil are in the same clock-wise direction, the circular conductor generates a first induction electromotive force, and when loading currents of the first coil and the second coil are in opposite clock-wise direction, the 8-shape conductor generates a second induction electromotive force.

15. The transformer hybrid according to claim 14, wherein the shape of the first circular portion and the second circular portion is circle loop, square loop, rectangular loop, or polygon loop.

16. The transformer hybrid according to claim 14, wherein the shape of the first coil and the second coil is circle loop, square loop, rectangular loop, or polygon loop.

17. The transformer hybrid according to claim 14, wherein each of the first coil and the second coil has at least one turn winding.

18. The transformer hybrid according to claim 14, wherein the first cross portion of the 8-shape conductor has two different level heights on the substrate.

19. The transformer hybrid according to claim 14, wherein the circular conductor further comprises a second cross portion overlapping the 8-shape conductor, and the second cross portion and the 8-shape conductor have different level heights on the substrate.

20. The transformer hybrid according to claim 14, wherein the circular conductor further comprises a third cross portion overlapping the first coil or the second coil, and the third cross portion and the first coil or the second coil have different level heights on the substrate.

21. The transformer hybrid according to claim 14, wherein the 8-shape conductor further comprises a fourth cross portion overlapping the first coil or the second coil, and the fourth cross portion and the first coil or the second coil have different level heights on the substrate.

* * * * *